United States Patent
Chang et al.

(10) Patent No.: US 6,658,616 B1
(45) Date of Patent: Dec. 2, 2003

(54) METHOD FOR IMPROVING THE EFFICIENCY OF WEIGHTED RANDOM PATTERN TESTS THROUGH REVERSE WEIGHT SIMULATION USING EFFECTIVE PATTERN MASKS

(75) Inventors: Paul Chang, Endwell, NY (US); David Pruden, Endwell, NY (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/444,781

(22) Filed: Nov. 22, 1999

(51) Int. Cl.$^7$ ................. G01R 31/3183; G01R 31/3177
(52) U.S. Cl. ................. 714/728; 714/732; 714/739
(58) Field of Search ................. 324/73.1; 714/728, 714/732, 739, 738

(56) References Cited

U.S. PATENT DOCUMENTS

| | | | |
|---|---|---|---|
| 4,687,988 A | | 8/1987 | Eichelberger et al. |
| 4,801,870 A | | 1/1989 | Eichelberger et al. |
| 5,043,988 A | * | 8/1991 | Brglez et al. ............. 714/739 |
| 5,479,414 A | | 12/1995 | Keller et al. |
| 5,831,996 A | * | 11/1998 | Abramovici et al. ....... 714/738 |
| 5,983,380 A | * | 11/1999 | Motika et al. ............. 714/733 |

FOREIGN PATENT DOCUMENTS

| | | | | |
|---|---|---|---|---|
| JP | 05134015 A | * | 5/1993 | ............ G01R/31/28 |

OTHER PUBLICATIONS

Waicukauski, et al. "Testing VLSI Chips with Weighted Random Patterns" Site Tech Library pp. 149–154.
Waicukauski, et al. "Fault Detection Effectiveness of Weighted Random Patterns" 1988 IEEE—1988 International Test Conference. Paper 15.2 pp. 245–255.
Waicukauski, et al. "A Method for Generating Weighted Random Test Patterns" IBM J. Res. Develop. vol. 33 No. 2 Mar. 2, 1989 pp. 149–160.
Kapur, et al. "Design of an Efficient Weighted Random Pattern Generation System" 1994 IEEE—1994 International Test Conference. Paper 21.2 pp. 491–500.
Chang, et al. "A Highly Efficient Weight Generation Method for Handling Very Large Fan–In and XOR–Tree Designs" 7$^{th}$ IEEE NATW, May 1998 pp. 34–41.

* cited by examiner

Primary Examiner—R. Stephen Dildine
(74) Attorney, Agent, or Firm—Orrick, Herrington & Sutcliffe LLP

(57) ABSTRACT

A method is defined which reduces the number of applied test patterns while maintaining identical fault coverage for a given set of weighted random patterns. Reduction is accomplished by simulating the weight sets in reverse order against a full (untested) fault list but allowing fault mark-off for initially effective patterns only (patterns which detected faults). This results in some patterns which initially detected only a few faults (due to their exposure to a small untested fault list) to detect a greater number of faults (due to their exposure to a full fault list), while other patterns which were initially effective become ineffective (detected no faults). Since the same faults are still detected there is no loss of coverage. Only those patterns which remain effective after exercising the reverse simulation are ultimately applied on the tester.

13 Claims, 6 Drawing Sheets

METHOD FOR IMPROVING THE EFFICIENCY OF WEIGHTED RANDOM PATTERN TESTS THROUGH REVERSE WEIGHT SIMULATION USING EFFECTIVE PATTERN MASKS

FIELD OF THE INVENTION

This invention is generally related to VLSI testing and, more particularly, to a method of minimizing test pattern counts by reversing the order of test simulation against a full fault list during weighted random pattern test generation.

DEFINITIONS

The following definitions are being provided to facilitate the understanding of the various terms being used throughout the description of this invention.

Deterministic Test—Electronic chip test data algorithmically derived by determining the necessary chip input stimulus and corresponding expected responses which will detect faults within the chip.

Fault—A representation of a circuit failure which drives an Automatic Test Pattern Generation (ATPG) algorithm to derive a set of circuit inputs which allow for observation of a circuit failure.

WRP—Weighted Random Pattern(s). An electronic chip test methodology which uses specialized hardware to generate test stimuli and collect circuit responses. The stimuli consist of random binary values, one for each circuit input and scan latch, generated by a PRPG and then "weighted" towards a 0 or 1 in order to increase the probability of detecting specific faults. Circuit responses are collected as a signature by a SISR.

PRPG—Pseudo Random Pattern Generator. A hardware device in an electronic chip tester, which, once seeded, produces a repeatable sequence of pseudo-random binary values each time the device is cycled.

SISR—Single Input Signature Register. A response compression device which accumulates one or more circuit responses and compresses them into a signature. Any faulty circuit response absorbed into the signature register circuit inputs will, with a high degree of certainty, cause the resultant signature to be different from what it would be in the absence of a faulty circuit response.

Seed Data—Initial values for the PRPGs and SISRs. A given PRPG seed will always generate the same series of values each time the device is cycled.

Pattern—One test consisting of the application of a clocking sequence along with all other associated activity such as the repeated cycling of the PRPG to refresh the stimuli to be applied to the circuit primary inputs and scan latches and the compression of test results into signature registers.

Test—The order of application of test stimuli I to the electronic chip.

Clocking Sequence—Identifies the circuit clocks and the order in which they are used to release and/or capture values in circuit latches.

Effective Pattern Mask—A string of bits (0 and 1) indicating which patterns of a given weight set the PRPG detect at least one fault when applied to the circuit. There is one bit per pattern. Ineffective patterns can be skipped using special "fast forward" hardware, thus saving test application time.

Weight Set—A set of information which defines the derived biasing for circuit inputs and scan latches. Weights range in value from 0 (never a 1) to 1 (always a 1) and fractional values in between (e.g., a 1 half the time (0.5) or a 1 one quarter of the time (0.25), etc.).

Signature—The resulting set of binary values contained within the SISR which is unique for a correctly responding circuit. A circuit which produces one or more incorrect responses to the applied stimulus would result in a signature which is different, thus identifying a failing circuit.

BACKGROUND OF THE INVENTION

With the increase in chip density, the test data volume associated with deterministically derived tests is becoming prohibitive. Weighted Random Pattern (WRP) testing offers a viable solution to this problem since input stimuli I are dynamically generated, and product responses are compressed into signatures by tester special hardware devices. Thus, the majority of the test data volume associated with WRP consists of a small amount of "weight set" information, stimuli generation and signature compression hardware "seeds" (initialization values), effective pattern masks, and product response signatures.

The WRP testing approach has been used in the industry for many years and much has been published about it as, for instance, in articles by:

J. A. Waicukauski and E. Lindbloom entitled "Fault detection effectiveness of weighted random patterns" published in the Proceedings of the 1988 International Test Conference, pp. 245–255. This paper describes the design of an efficient WRP system wherein performance results are given and deterministic and WRP tests are created for single stuck faults and compared with respect to their ability to detect shorts and transition faults.

J. A. Waicukauski, E. Lindbloom, E. B. Eichelberger and O. P. Forlenza, "A method for generating weighted random test patterns", published in the IBM Journal of . Research and Development of March 1989, pp. 149–160, wherein the advantage of using weighted random patterns versus deterministic patterns is described., alongside with an algorithm for calculating an initial set of input-weighting factors and a procedure for obtaining complete stuck-fault coverage .

R. Kapur, S. Patil, T. Snethen and T. Williams, "Design of Efficient Weighted Random Pattern Generation System", International Test Conference, 1994, describes a method for measuring the performance of the system by the number of weight sets and the number of WRP required to achieve a high coverage.

P. Chang, B. Keller and T. Snethen, "A highly efficient weight generation method for handling very large fan-in and XOR-tree designs", IEEE North Atlantic Test Workshop, 1998, pp. 34–41 described a technique for merging deterministic test patterns to derive weight sets used for WRPT.

In addition to the above publications, the following patents apply:

U.S. Pat. No. 4,801,870 to E. Eichelberger, et al., issued January 1989, describes a method and apparatus for testing Level Sensitive Scan Designs (LSSD) integrated circuits by applying differently configured sequences of pseudo-random patterns; and U.S. Pat. No. 5,479,414 to P. N. Keller, et al. issued December 1995 describes algorithmically generated test patterns which are structured for efficient test of "scan paths" logic devices, and wherein look ahead test pattern generation and simulation ("fast forward") schemes achieve a pre-specified fault coverage.

One problem with WRP testing however is that, by its very nature, it depends on pseudo-random patterns to detect faults. Even with biasing (i.e., weighting) to improve the probability of fault detection, WRP patterns tend to require from 2 to 20 times the number of patterns vs. deterministic tests. So, while WRP testing provides test data volume relief, it tends to drive up the cost due to increased test time .

In order to better understand the method described in the present invention an example of the process to obtain a set of WRP test patterns is described hereinafter.

a) Deterministic test patterns are initially derived for a set of selected faults. The number of times a circuit input (either primary input or a scan latch) is required at a "1" value divided by the number of tests requiring a 0 or 1 value determines a unique weight for that input. e.g., a weight of 0.75 would be derived when a 1 is required for 3 out of 4 patterns. By way of example, and with reference to the table shown hereinafter, faults F1, F2, F3, and F4 were selected and the following deterministic patterns were derived for a circuit which has 8 inputs (which could be any mix of primary inputs and/or scan latches):

| Fault | Input 1 | Input 2 | Input 3 | Input 4 | Input 5 | Input 6 | Input 7 | Input 8 |
|---|---|---|---|---|---|---|---|---|
| F1 | 1 | 1 |   |   |   |   |   | 0 |
| F2 |   | 1 | 0 | 0 |   |   |   |   |
| F3 | 0 | 0 | 1 |   | 0 | 1 | 1 | 0 |
| F4 | 0 | 0 | 1 | 0 | 1 | 1 |   |   |
| Wt | 0.33 | 0.5 | 0.66 | 0 | 0.5 | 1 | 1 | 0 |

Assuming that the clocking sequences for all the above tests are compatible, the weights for each input are shown in the last row (Wt). Since current PRPG hardware is limited to a fixed set of weights, the above values are rounded accordingly. For example, PRPG using 4 taps would support weights of: 0 (never a 1), 0.0625 ($\frac{1}{16}$), 0.125 ($\frac{1}{8}$), 0.25 ($\frac{1}{4}$), 0.5 ($\frac{1}{2}$), 0.75 ($\frac{3}{4}$), 0.875 ($\frac{7}{8}$), 0.9375 ($\frac{15}{16}$), and 1 (never a 0). Thus, the above weights would be adjusted as follows.

| Wt | 0.25 | 0.5 | 0.75 | 0 | 0.5 | 1 | 1 | 0 |
|---|---|---|---|---|---|---|---|---| b) A random pattern is then generated by a software model of the Pseudo Random Pattern Generator (PRPG) hardware. The random value for each circuit input is biased by its respective weight generated in step a. Biasing is accomplished by "ANDing" (weights $\leq 0.5$) or "ORing" (weights >0.5) up to 4 PRPG values. For example, a weight of 0.25 is created by ANDing two PRPG bit positions such that there is probability that the input will beat 1 one-fourth of the time.

c) The resulting pattern is then simulated to determine the product response and the fault coverage . The product response is compressed into a signature by a software model of the Single Input Signature Register (SISR) hardware which is connected to each product output, including scan outputs. This step also sets a bit in the "effective pattern" mask. This mask identifies those patterns which detect at least one fault. It is used during test to allow the tester, through the use of special hardware, to skip patterns which are ineffective, i.e., detect no faults, thus saving test application time.

Steps b) and c) repeat until a predefined termination condition is met, e.g., less than x % fault coverage increase or a specified number of patterns.

Steps a), b), and c) repeat until various termination conditions have been met, e.g., when no untested faults are left to process or when a particular overall percent tested threshold has been reached or a maximum weight set count has been reached. Since PRPG hardware recreates the patterns which were simulated and applies them to the circuit and SISR hardware compresses the circuit responses into signatures which can be compared to the simulated signatures, the test data information obtained from this process is merely the derived weight sets, the PRPG and SISR seed values, the effective pattern masks, the calculated product signatures, and the product clocking sequences used to release and capture values from the scan latches. This is a significant reduction in the amount of data versus conventional deterministic testing.

It should be noted that tester PRPG and SISR hardware operate in a fixed manner. Thus, once the PRPGs are loaded with a particular seed and their clocks cycled they will create the same set of "random" values each time. Consequently, little can be done to alter the pseudo-random values created from each weight set. However, if the PRPGs and SISRs are reinitialized at the beginning of each weight set, each weight set can be considered to be independent. Consequently, the order of weight set application can be modified without changing the calculated results.

The results of the above process are represented in Table 1. Three weight sets were created. Weight set 1 created 6 patterns , weight set 2 created 6 patterns, and weight set 3 created 4 patterns. Of these 16 patterns, 9 detected at least 1 fault and thus were marked "effective".

TABLE 1

Results of a prior art (forward) WRP test generation/fault simulation

| Weight | Pattern | Effective? | Faults Tested |
|---|---|---|---|
| 1 | 1 | Y | F1.F2.F3.F9.F11.F15 |
|   | 2 | Y | F4 |
|   | 3 | N |   |
|   | 4 | Y | F5,F6 |
|   | 5 | Y | F7 |
|   | 6 | N |   |
| 2 | 1 | N |   |
|   | 2 | Y | F8,F10 |
|   | 3 | Y | F12 |
|   | 4 | N |   |
|   | 5 | N |   |
|   | 6 | Y | F13,F14 |
| 3 | 1 | Y | F16,F17,F18 |
|   | 2 | N |   |
|   | 3 | N |   |
|   | 4 | Y | F19,F20 |
| Totals | 16 | 9 | F1 through F20 Detected |

OBJECTS OF THE INVENTION

Accordingly, it is an object of this invention to improve the efficiency of WRP tests by minimizing the number of patterns required to achieve a given fault coverage and, thus, reduce the cost of using a WRP test methodology.

It is another object of the invention to minimize the number of test patterns by reversing the order of simulation against a full fault list in a WRP test.

SUMMARY OF THE INVENTION

In one aspect of the invention, the number of effective patterns is drastically reduced by resimulating the weight sets in the reverse order from which they were originally derived to detect all the faults in a fault dictionary. In reverse order.

In another aspect of the invention, only the test patterns found to be effective the first time, i.e., during the first simulation are further considered. During resimulation, patterns no longer found to be effective can now be totally eliminated from the test pattern set.

According to yet another aspect of the invention there is provided a method of testing chip circuitry in a weighted random pattern generation system that includes the steps of generating a series of weight sets from the weighted random pattern generation system; simulating in reverse order the weight sets from the weighted random pattern generation system; and producing a new effective pattern mask for each of the weight sets.

In still another aspect of the invention, there is provided a method for minimizing test pattern counts when testing an integrated circuit, that includes the steps of generating an initial set of weighted random test patterns (WRP) and determining which of the weighted random test patterns are effective in detecting at least one fault in a fault dictionary; selecting the WRP that were found to be effective, saving the weight, a seed and an effective pattern mask; eliminating all the remaining faults in the fault dictionary by successively modifying the weights required to generate the WRP and generating a new set of WRP from each of the modified weights; and resimulating with the new set of weights but applied in reverse order to obtain a reduced weight set capable for detecting all the faults in the fault dictionary.

BRIEF DESCRIPTION OF THE DRAWINGS

The foregoing and other objects, aspects and advantages of the present invention will be better understood from the following description of a preferred embodiment when taken in conjunction with the accompanying drawings, in which.

DETAILED DESCRIPTION OF THE PREFERRED EMBODIMENT OF THE INVENTION

Figure 1:
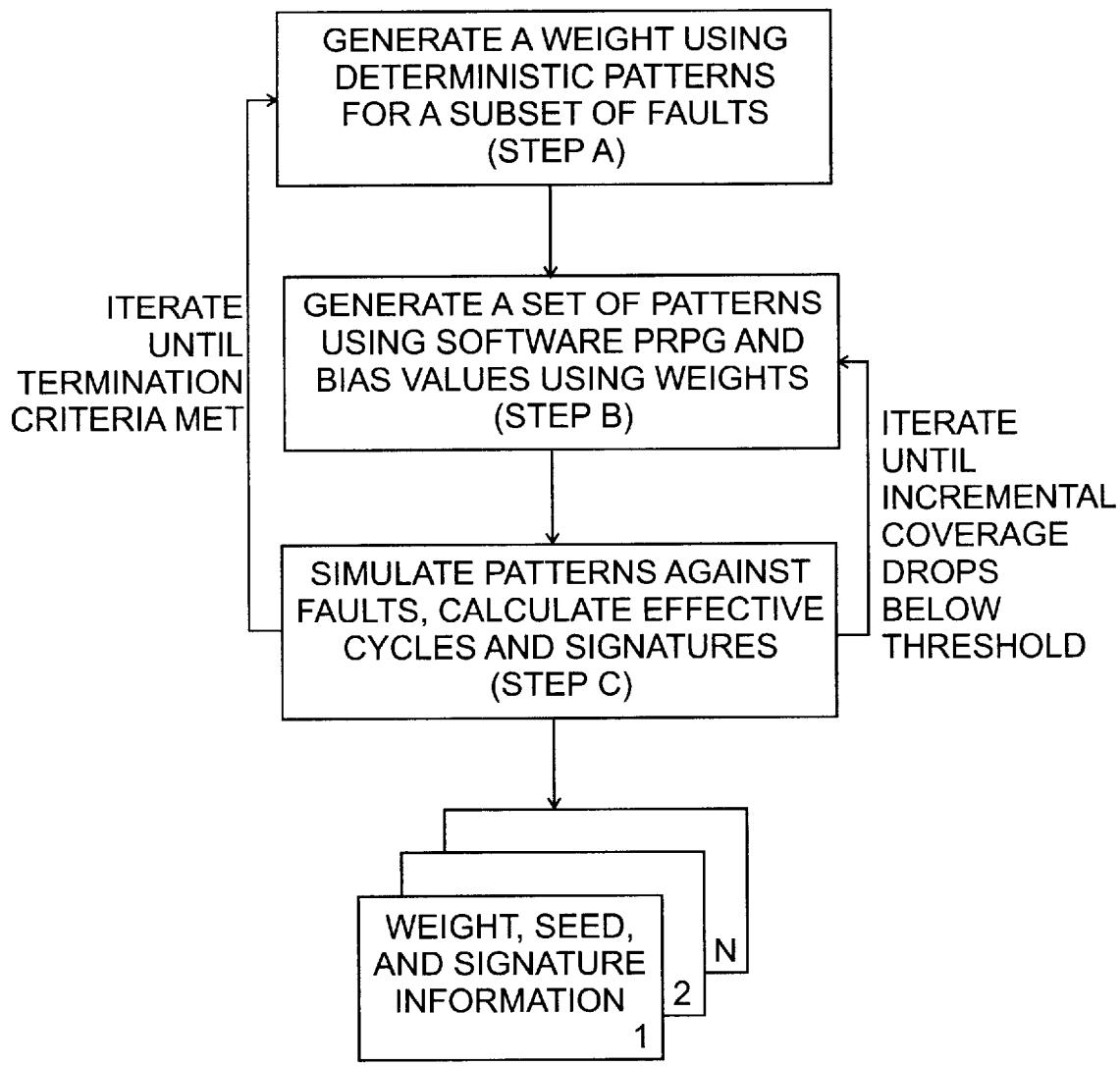
FIG. 1 shows a conventional representation of a conventional 'Forward' WRP algorithm showing the generation of weight sets and signature data.
Figure 2:
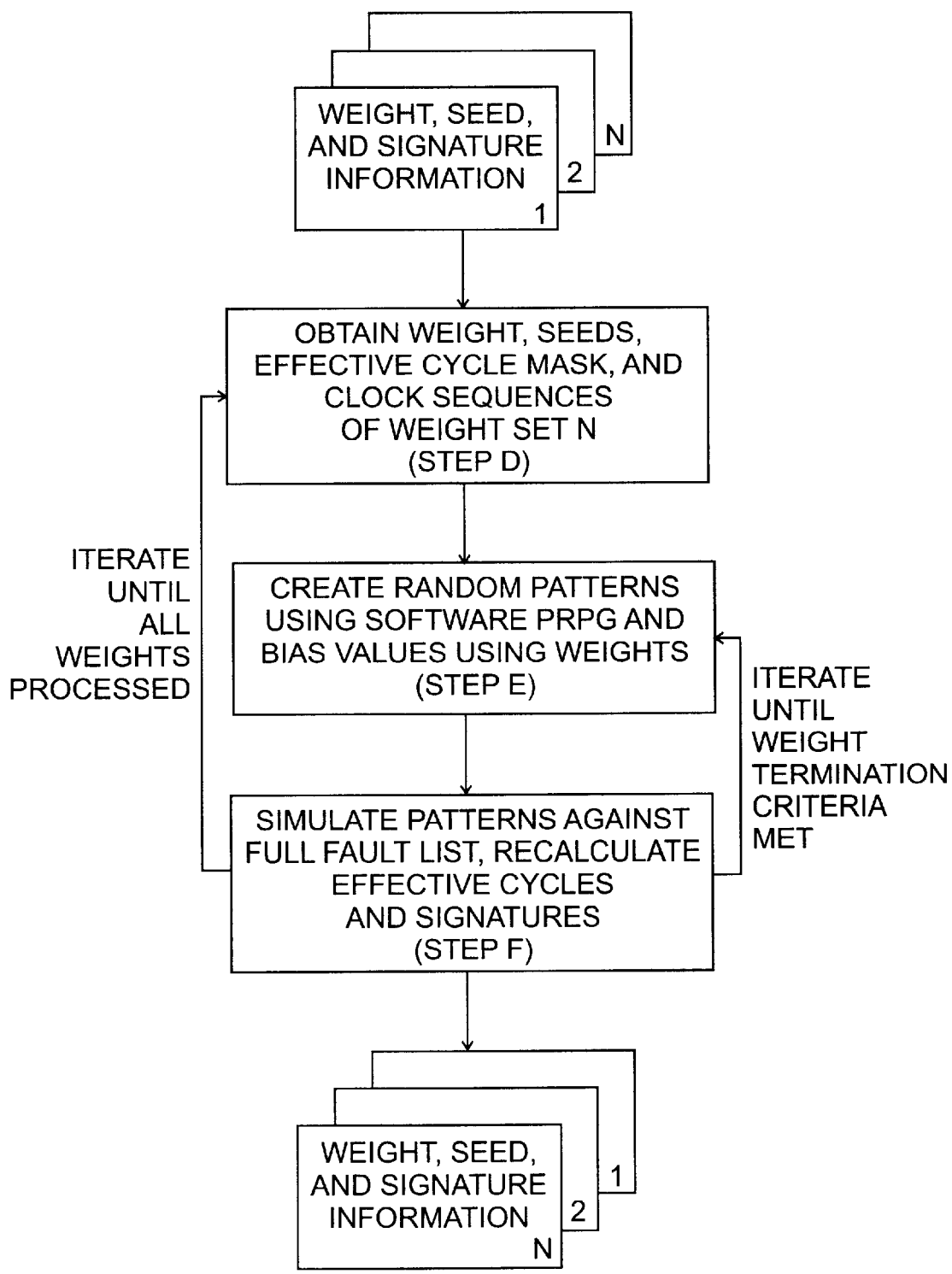
FIG. 2 is a flow chart showing the 'Reverse' WRP flow, in accordance with the invention.
Figure 3:
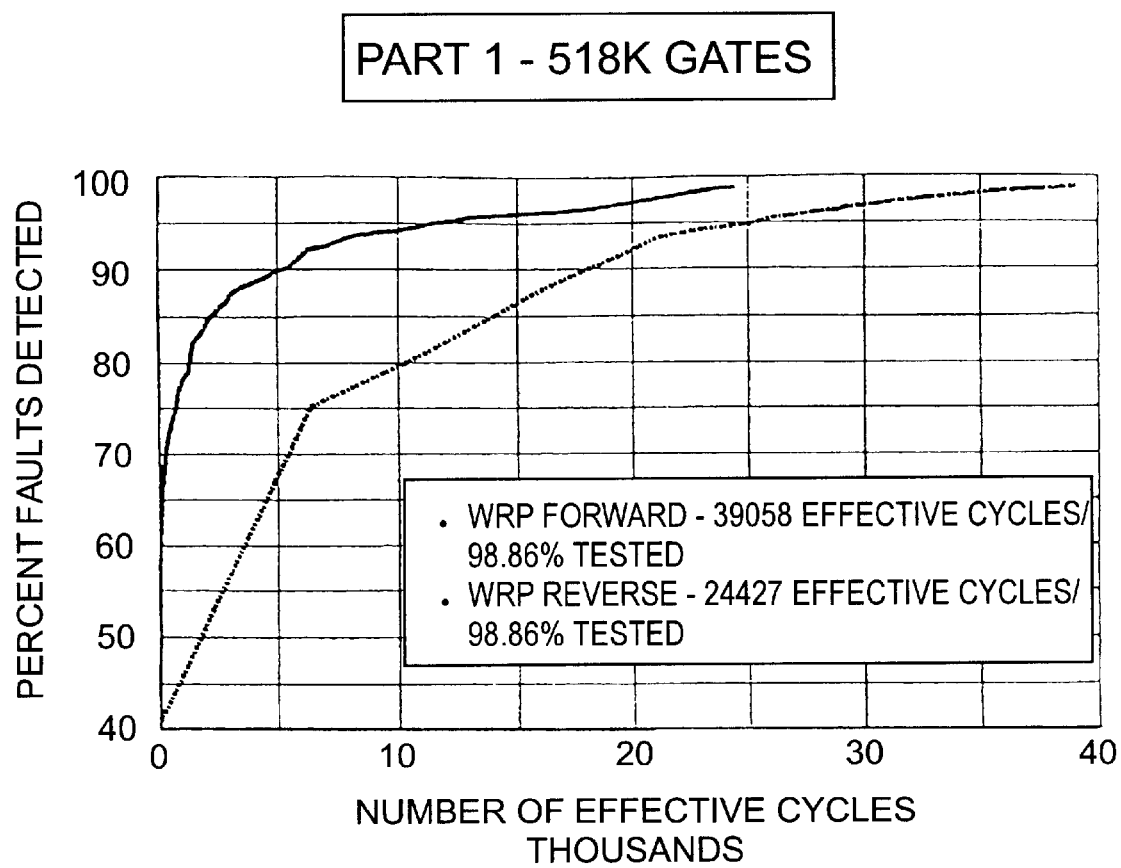
FIGS. 3–6 represent various graphs showing results of 37.5%, 36.7%, 49.7% and 43.4% reduction in the effective pattern count when comparing the conventional 'Forward' approach versus the 'Reverse' approach, of the present invention from circuits having 518K, 318K, 338K, and 478K gates, respectively.
Figure 4:
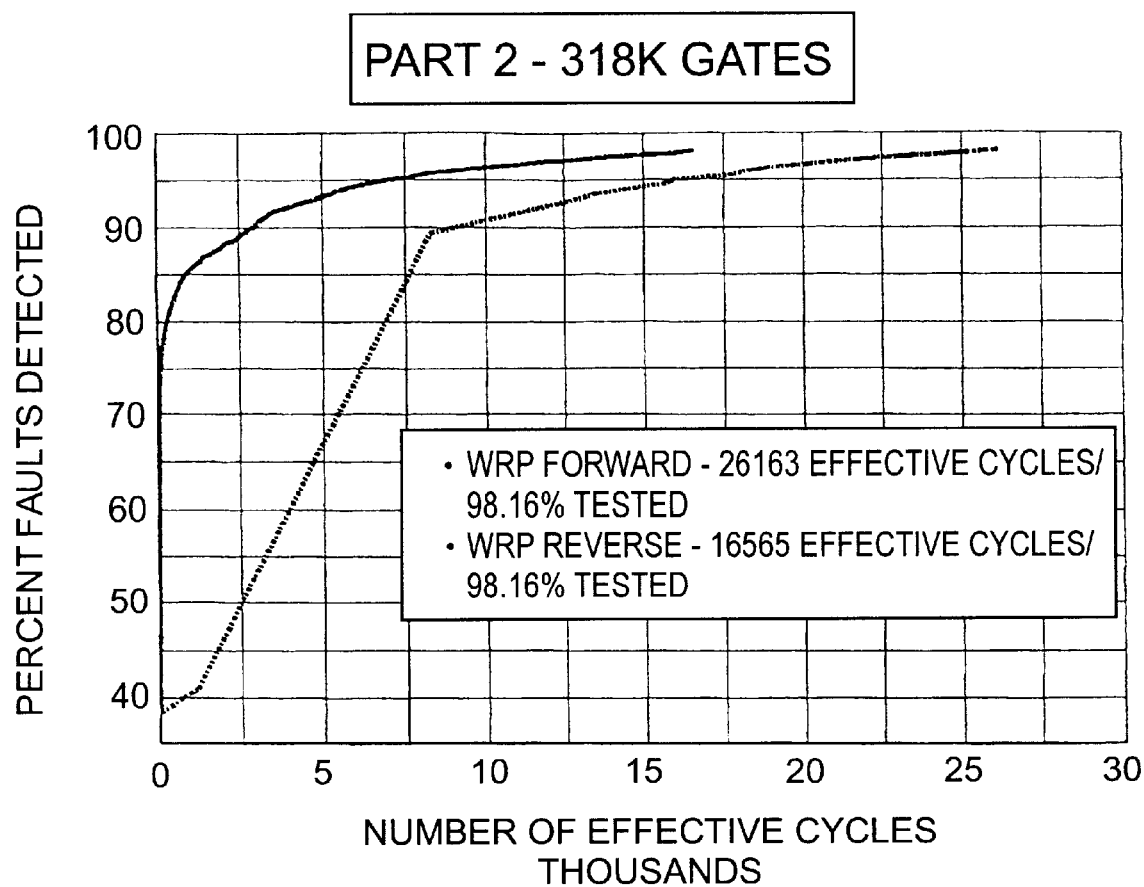
Figure 5:
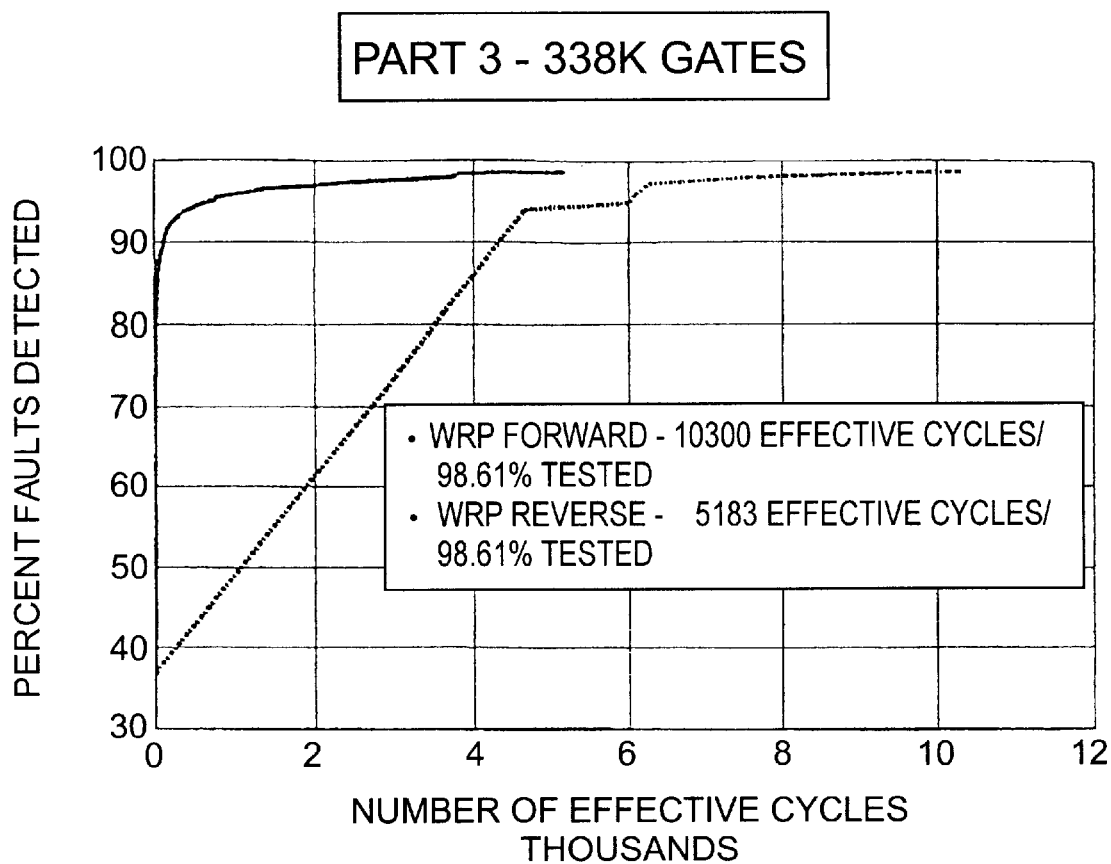
Figure 6:
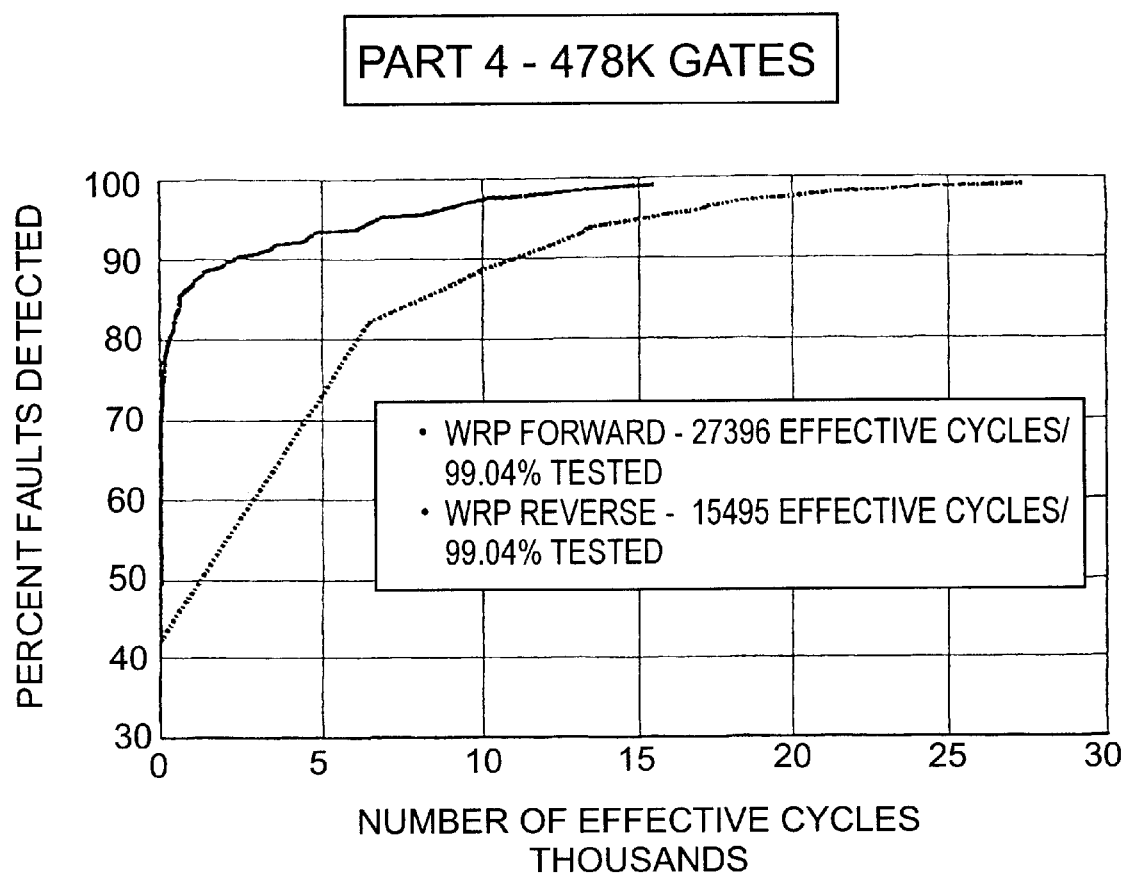

Referring now to FIG. 2, there is shown a simplified flow chart of the process according to the present invention.

By reversing the order (last to first) of the original weight sets and resimulating the patterns generated from each weight set, values are created by the PRPG and simulated against a fully untested list of faults. Moreover, by allowing fault mark-off for only the originally effective patterns, per the original effective pattern mask, a significant reduction in required pattern count can be achieved. The steps of the inventive methodology include:

d) Determining the weight, effective pattern mask, seeds and clock sequence information from the last weight set generated from the original test data.

e) Again, using a software model of the PRPG and weighting hardware, creating a weighted random pattern (as in step b).

f) Simulating each pattern created in step e against a newly initialized (full) set of faults. However, this time, instruct the simulator to mark off tested faults for only those patterns identified as effective by the original effective pattern mask (refer to step c).

As previously done, the circuit responses are collected in a software model of the SISR (Single Input Shift Register) and the effective pattern mask is recalculated to identify those patterns from step e) which detect at least 1 fault. The tested faults are marked off and removed from further consideration.

Steps e) and f) are repeated until some weight termination condition is met. Then, steps d), e), and f) are repeated selecting the weights (in step d) in reverse order until some process termination condition has been met.

By reversing the weight set order in this manner, some patterns which were originally effective become even "more" effective, i.e., detect more faults than they did originally. However, since detected faults are removed from the undetected fault list, some patterns no longer detect their original faults. And in fact, many patterns now detect no faults, i.e., they have become ineffective, and the corresponding effective pattern mask bits are turned off.

By way of example, if a weight set consists of 1000 test patterns, only a limited number of effective pattern mask bits, e.g., 50, are turned on, those bits representing the test patterns found to be effective. All other test patterns within the weight set have an effective pattern mask bit of 0. Only the 50 effective patterns need be applied to the circuit during testing. However, in order to obtain the 50 patterns, all the 1000 test patterns still must be generated even though 950 of those patterns do not contribute in any manner to the testing of the product. In addition, if all the effective pattern mask bits for a weight set have been set to 0, then the complete weight set can be eliminated, eliminating a complete weight set, obtaining a reduced set of patterns. Thus, not only the time to apply the patterns is saved, but the time to generate them is also avoided.

Table 2 represents the results obtained by reversing the order of weight sets and resimulating each pattern. The same 20 faults are detected by the original 3 weight sets of 16 patterns. However, only 16 patterns are now marked effective: a reduction of 33%. The faults listed in bold were detected by different patterns when reversed.

TABLE 2

Results of invention (reverse) WRP test generation/fault simulation

| Weight | Pattern | Effective | Faults Tested |
| --- | --- | --- | --- |
| 3 | 1 | Y | F2,F16,F17,F18,F20 |
|   | 2 | N |   |
|   | 3 | N |   |
|   | 4 | Y | F1,F3,F7,F19 |
| 2 | 1 | N |   |
|   | 2 | Y | F8,F10,F15 |
|   | 3 | Y | F4,F8,F9,F12 |
|   | 4 | N |   |
|   | 5 | N |   |
|   | 6 | Y | F11,F13,F14 |
| 1 | 1 | N | No faults detected |
|   | 2 | N | No faults detected |
|   | 3 | N |   |
|   | 4 | Y | F5,F6 |
|   | 5 | N | No faults detected |
|   | 6 | N |   |
| Totals | 16 | 6 | F1 through F20 Detected |

The method described herein was implemented and verified by way of four different chip designs. The results are displayed in FIGS. 3 through 6 showing reductions in pattern count ranging from 36.7% to 49.7% for chips having 318K to 518K gates.

Practitioners will readily appreciate that the method of the invention can be in the form of computer readable program code set to perform the various steps leading to testing the integrated circuit chip, module, card and the like. As it is known in the art, that computers have the capability of providing a computer usable medium embodied therein to implement the various steps of the invention in hardware. Finally, the invention can also be implemented by way of a program storage device (RAM, ROM, EPROM, EEPROM, etc.) to perform each step of the aforementioned inventive test methodology.

While the invention has been described in terms of a single preferred embodiment, those skilled in the art will readily recognize that the invention can be practiced with many changes and modifications, particularly in the nature of the various steps leading to the final set of weights, seed and signature information, all of which fall within the spirit and the scope of the appended claims.

Having thus described the invention, what is claimed as new and desired to be secured by Letters Patents is as follows:

1. A method of testing chip circuitry in a weighted random pattern generation system comprising the steps of:
    generating a series of weight sets from the weighted random pattern generation system;
    simulating in reverse order the weight sets from the weighted random pattern generation system; and
    producing a new set of effective test pattern masks for each of the weight sets.

2. The method as recited in claim 1, further comprising the step of storing for each of the weight sets the weight, the PRPG and SISR seeds and an effective pattern mask, wherein the weight sets collectively detect faults in the fault dictionary.

3. The method as recited in claim 1, further comprising the step of computing new signatures from the weight sets.

4. The method as recited in claim 1, further comprising the step of eliminating within each of the effective pattern masks the patterns found to be ineffective, thereby reducing the set of patterns to be generated when testing the chip circuitry.

5. The method as recited in claim 4, further comprising the step of setting to 0 all bits within each of the effective pattern masks corresponding to ineffective patterns and further removing the weight sets having all 0's.

6. The method as recited in claim 5, wherein by eliminating the set weights having all 0s, the number of test patterns to be generated at the tester is reduced thereby maximizing tester throughput.

7. A method for minimizing test pattern counts when testing an integrated circuit, comprising the steps of:
    generating an initial set of weighted random test patterns (WRP) and determining which of the weighted random test patterns are effective in detecting at least one fault in a fault dictionary;
    selecting the WRP that were found to be effective, saving the weight, a seed and an effective pattern mask;
    eliminating all the remaining faults in the fault dictionary by successively modifying the weights required to generate the WRP and generating a new set of WRP from each of the modified weights; and
    resimulating with the new set of weights but applied in reverse order to obtain a reduced weight set capable for detecting all the faults in the fault dictionary.

8. A method for generating a set of weighted random test patterns from an original set of weighted random test patterns for testing an integrated circuit, the method comprising the steps of:
    a) determining a weight, a seed and an effective pattern mask used in generating the original set of weighted random test patterns;
    b) using a software model of a pseudo random pattern generator and weighting means, creating a new set of weighted random test patterns;
    c) simulating each weighted random test pattern created in step b) against a newly initialized set of faults; and
    d) marking off faults from the initialized set of faults only for patterns which have the corresponding effective pattern mask bit set to 1; and
    e) resimulating using the weights corresponding to the initial set of weighted random test patterns in reverse order to obtain a reduced set of test patterns to be applied during testing.

9. The method as recited in claim 8, further comprising the step of determining seeds to respectively provide an initial test pattern to the pseudo random pattern generator (PRPG), and clock sequence information to determine the stimuli to be applied to primary inputs of the integrated circuit, for propagating the stimuli through the integrated circuit up to its outputs, to generate a signature.

10. The method as recited in claim 9, wherein the signature is obtained by simulation.

11. The method of claim 10, wherein the signature obtained by simulation is compared to the signature obtained by performing a test on a tester with the test patterns generated by the simulation.

12. A computer program product comprising:
    a computer usable medium having computer readable program code means embodied therein for causing chip circuitry to be tested with a weighted random pattern generation system,
    the computer readable program code means in the computer program product comprising:
        computer readable program code means for causing a computer to generate a series of weight sets from the weighted random pattern generation system;
        computer readable program code means for causing the computer to simulate in reverse order the weight sets from the weighted random pattern generation system; and
        computer readable program code means for causing the computer to produce a new effective pattern masks for each of the weight sets.

13. A program storage device readable by a machine, tangibly embodying a program of instructions executable by the machine to perform method steps for testing chip circuitry in a weighted random pattern generation system comprising the steps of:
    generating a series of weight sets from the weighted random pattern generation system;
    simulating in reverse order the weight sets from the weighted random pattern generation system; and
    producing a new effective pattern mask for each of the weight sets.

* * * * *